United States Patent
Wang

(10) Patent No.: US 6,688,377 B2
(45) Date of Patent: Feb. 10, 2004

(54) LOOP HEAT PIPE MODULARIZED HEAT EXCHANGER

(76) Inventor: Ching-Feng Wang, No. 13, Lane 138, Wanda Rd., Yangmei Jen, Taoyuan Hsien (TW)

( * ) Notice: Subject to any disclaimer, the term of this patent is extended or adjusted under 35 U.S.C. 154(b) by 74 days.

(21) Appl. No.: 10/173,639

(22) Filed: Jun. 19, 2002

(65) Prior Publication Data

US 2003/0168207 A1 Sep. 11, 2003

(30) Foreign Application Priority Data

Mar. 8, 2002 (TW) ........................................ 91104434 A

(51) Int. Cl.[7] ................................................ F28D 15/00
(52) U.S. Cl. ............. 165/104.26; 165/185; 165/104.21; 165/104.33; 361/700; 174/15.2; 257/715
(58) Field of Search ...................... 165/104.33, 104.26, 165/185; 361/699, 700; 174/15.2; 257/715, 716; 29/890.032

(56) References Cited

U.S. PATENT DOCUMENTS

| | | | | |
|---|---|---|---|---|
| 5,329,993 A | * | 7/1994 | Ettehadieh | 165/104.14 |
| 5,947,193 A | * | 9/1999 | Adkins et al. | 165/104.26 |
| 6,005,772 A | * | 12/1999 | Terao et al. | 361/699 |
| 6,076,596 A | * | 6/2000 | Osakabe et al. | 165/104.33 |
| 6,082,443 A | * | 7/2000 | Yamamoto et al. | 165/104.26 |
| 6,321,831 B1 | * | 11/2001 | Tanaka et al. | 165/104.33 |

* cited by examiner

Primary Examiner—Terrell McKinnon
(74) Attorney, Agent, or Firm—Troxell Law Office PLLC

(57) ABSTRACT

A circuit type modularized heat exchanger system comprises a heat exchange unit and a vapor chamber. The vapor chamber is jointed to the bottom of the heat exchange unit. The vapor chamber has a hollow space with a wick layer and the hollow space communicates with the tube tubes of the heat exchange unit so as to form a circuit. The heat exchanger system provides the advantages such as a better efficiency of heat transfer, less component parts and easy assembly and manufacture.

18 Claims, 13 Drawing Sheets

82

LOOP HEAT PIPE MODULARIZED HEAT EXCHANGER

BACKGROUND OF THE INVENTION

1. Field of the Invention

The present invention relates to a heat exchanger system, particularly to a loop heat pipe modularized heat exchanger system.

2. Description of Related Art

A conventional CPU-mounted heat exchanger, as shown in FIG. 1, comprises an attach block 10', a heat pipe 11', a heat exchanging unit 12', and a fan 13'. The attach block 10' is mounted on a CPU 20'. The heat pipe 11' connects with the attach block 10' and the heat exchanging unit 12' respectively. The fan 13' is disposed by the heat exchanging unit 12' to supply air for dissipating heat from the heat exchanging unit. As shown in FIG. 2, the heat pipe 11' is filled with a wick layer 111' so that fluid which evaporates easily flows inside the heat pipe 11' along the wick layer 111'. The heat pipe 11' has a heated end connected to the attach block 10' and a cooled end connected to a lower side of the heat exchanging unit 12'. The attach block 10' conducts heat generated by the CPU 20' and cause fluid in the heat pipe 11' to evaporate as vapor so that the vapor can absorb the heat and cool the CPU 20'. At the cooled end of the heat pipe 11', the vapor condensates and returns to the heated end 112' to be heated and evaporated again, performing a heat-exchange cycle. Liquid and vapor in the heat pipe 11' flow counter to each other in a single pipe and pressure loss is large. If the heat pipe 11' is long, the efficiency of heat exchange is worse. There is no way tightly to engage the cooling end to a base or fins of the heat exchange unit 12' so that it results in a relatively large thermal resistance. The contact area between the heated end and the attach block is limited and it is not possible to eliminate a generated clearance between the heated end and the attach block so that the efficiency of heat transfer is low. If the attach block 10' is thicker, it will result in a larger thermal resistance to affect the efficiency of heat dissipation. Conventional heat exchangers not only have the shortcomings mentioned above but are also expensive to manufacture due to a large number of single components.

SUMMARY OF THE INVENTION

It is the main object of the present invention to provide a loop heat pipe modularized heat exchanger system with good efficiency of heat transfer.

Another object of the present invention is to provide a loop heat pipe modularized heat exchanger system with less component parts and easy assembly and manufacture.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 1:
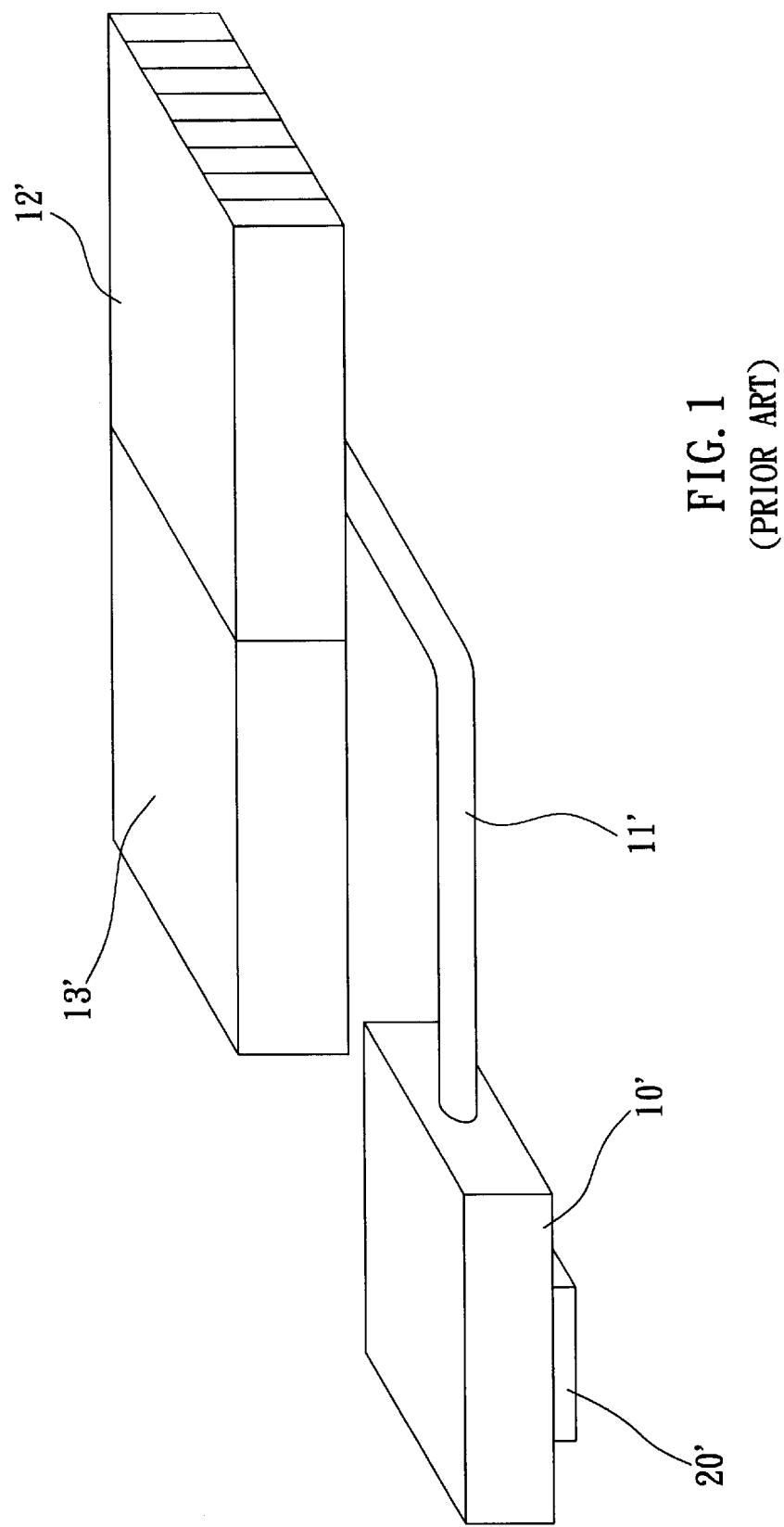
FIG. 1 is a perspective view of a conventional heat exchanger.
Figure 2:
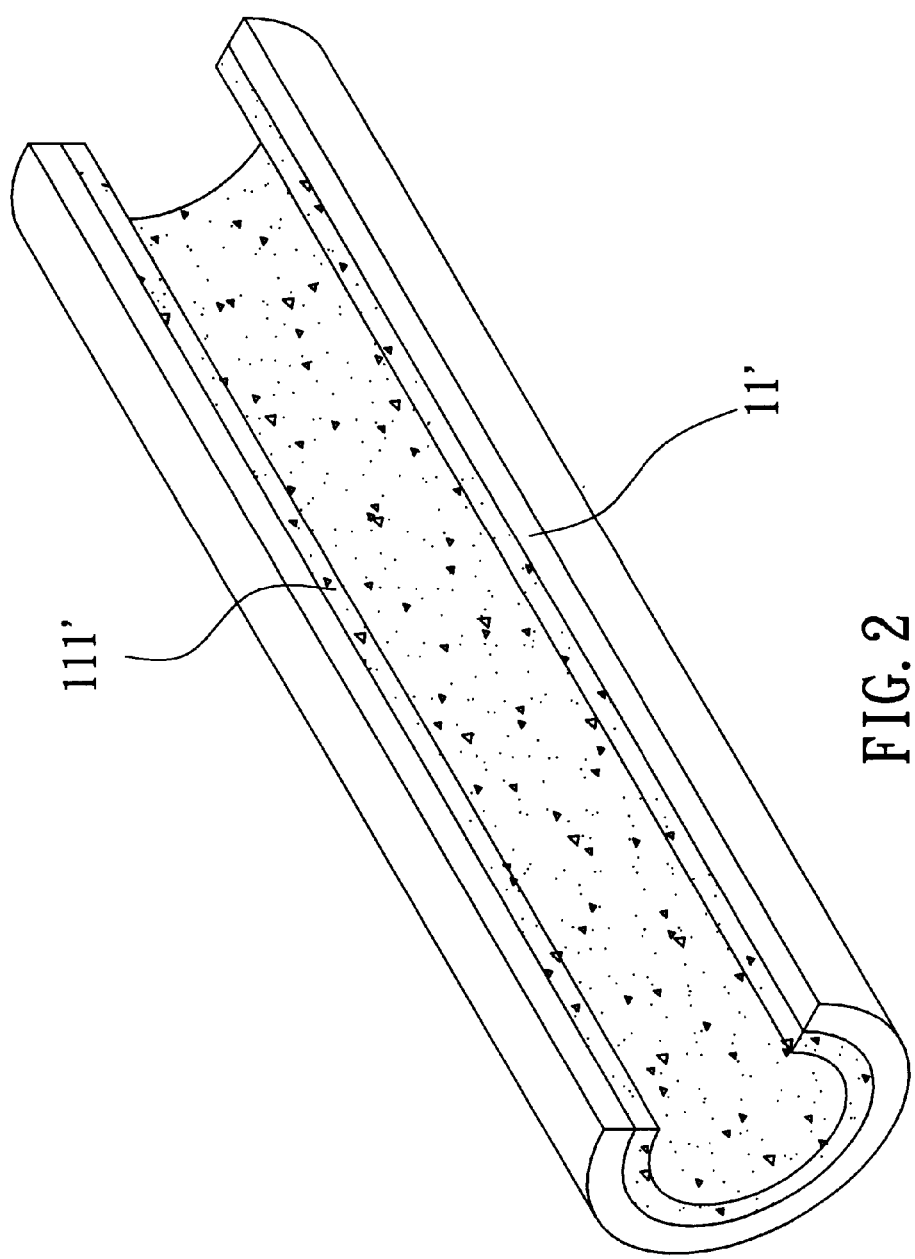
FIG. 2 is a schematic illustration of a conventional heat pipe.
Figure 3:
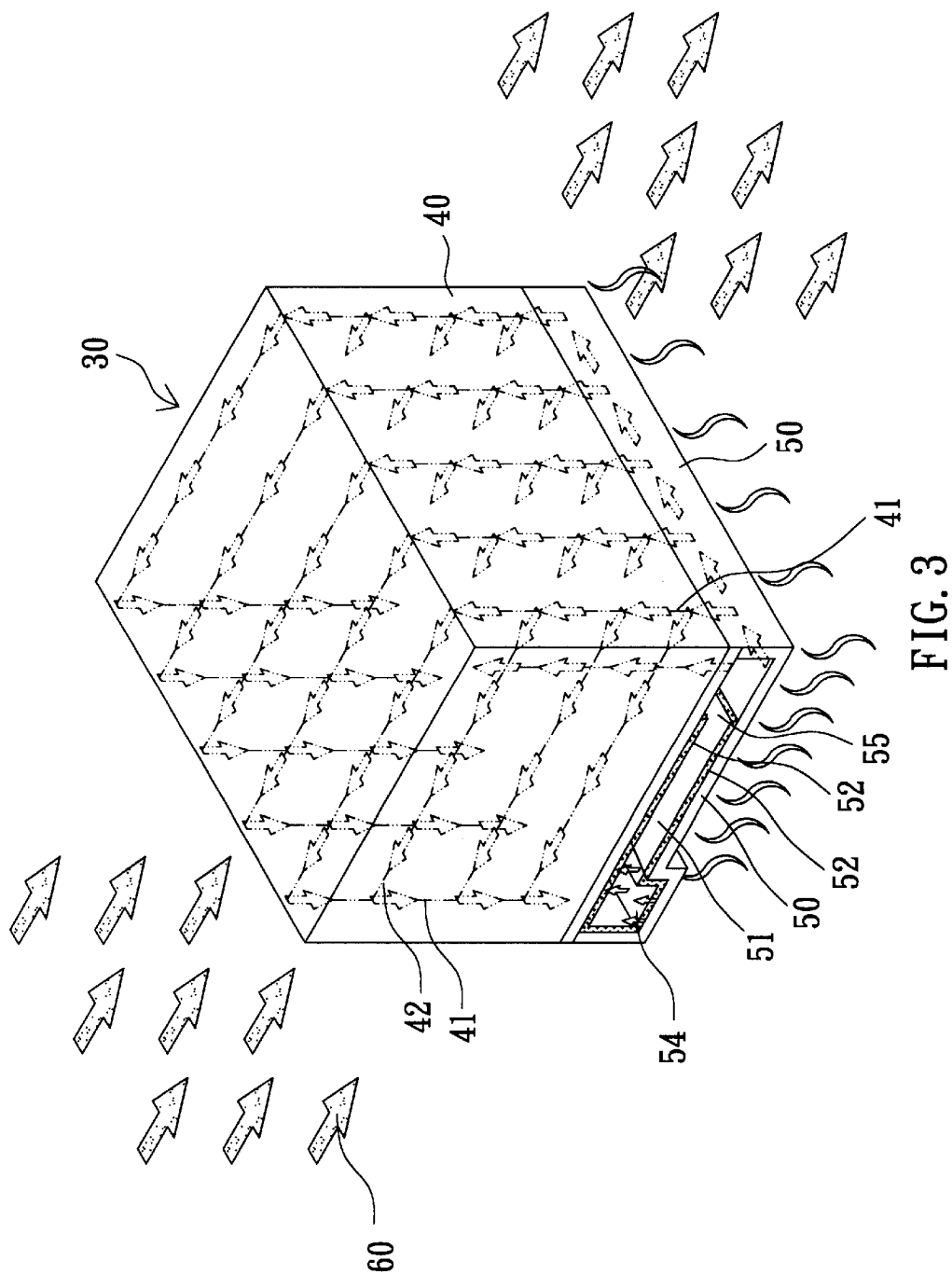
FIG. 3 is a perspective view of a heat exchanger according to the present invention during use.
Figure 4:
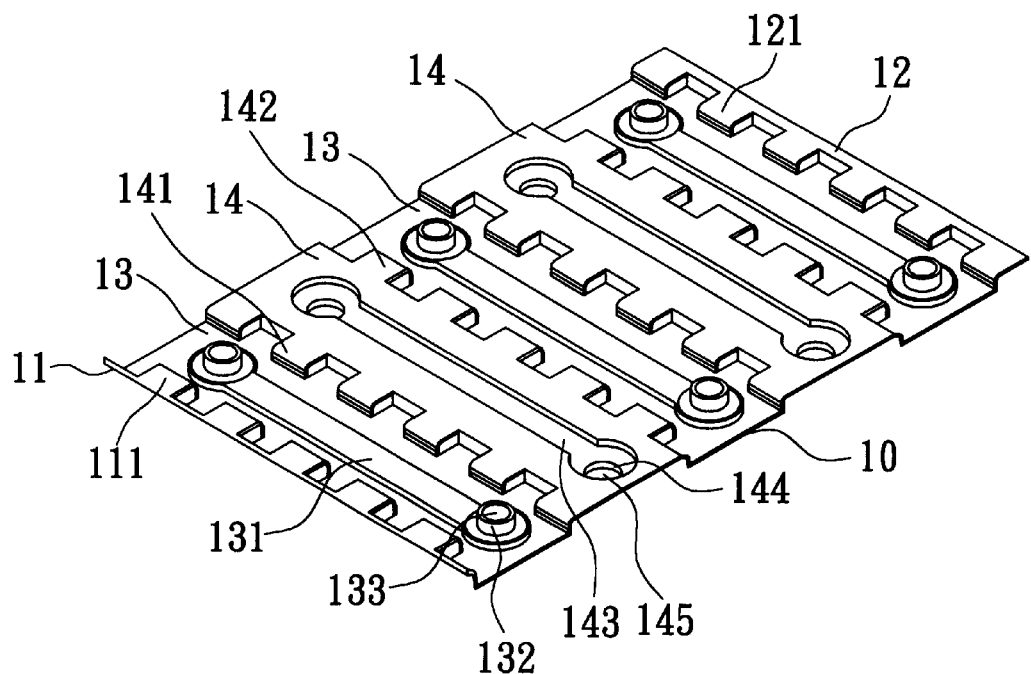
FIG. 4 is a perspective view of a base plate of the present invention in a first embodiment.

As shown in FIG. 3, a heat exchanger 30 of the present invention comprises a heat exchange unit 40 and a vapor chamber 50 connected thereto. As shown in FIG. 4, the heat exchange unit 40 further comprises a plurality of metal base plates 10 worked by a press or rolled by a cutter. Each of the base plates 10 at two ends thereof has a first projection 11 and a second projection 12, respectively, and at a middle part thereof having a plurality of depressions 13 and projections 14 alternately disposed side by side. The first and second projections 11, 12 have regularly arranged inward extending projecting sections 111, 121, and the projections 14 each have regularly arranged projecting sections 141, 142 extending to opposite sides. An elongated ridge 131 is placed in each depression 13, both ends thereof having connecting tubes 132 that reach up to the level of the top surfaces of the projections 14. Similarly, a groove 143 is placed in each projection 14, both ends thereof having connecting tubes 144 that reach down to the level of the bottom surfaces of the depressions 13. The connecting tubes 132 have through holes 133 at upper ends thereof, and the connecting tubes 144 have through holes 145 at lower ends thereof so that the ridges 131 and the grooves 143 have shapes corresponding to each other.

Figure 5:
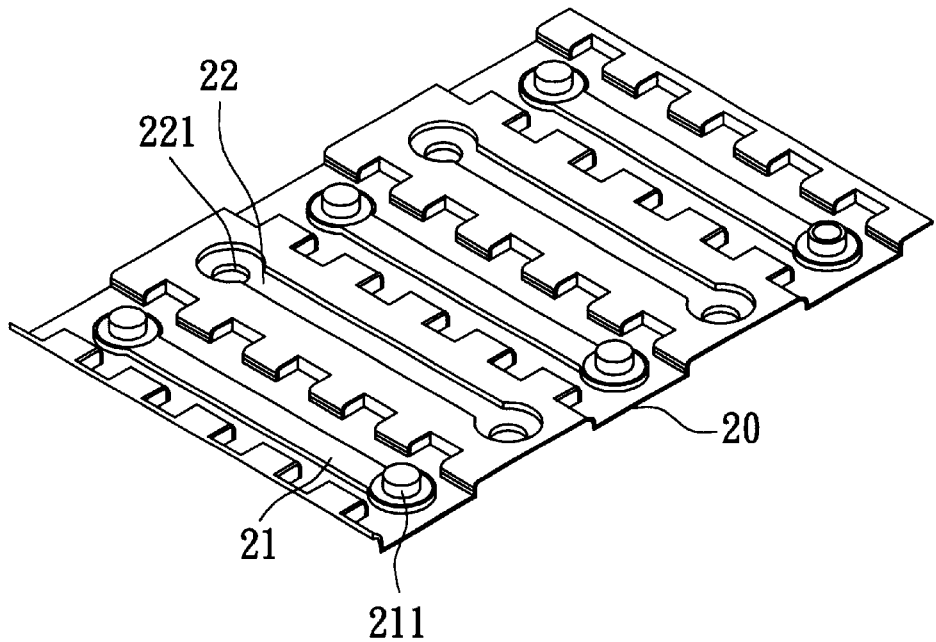
FIG. 5 is a perspective view of an external plate of the present invention in the first embodiment.

Referring to FIGS. 4 and 5, an external plate 20 of the present invention closes the through holes 133 and the grooves 143 from above. The external plate 20 is shaped like the base plates 10, but connecting tubes 211 at the upper ends thereof and the connecting tubes 221 at the lower ends thereof provide no through hole.

Figure 6:
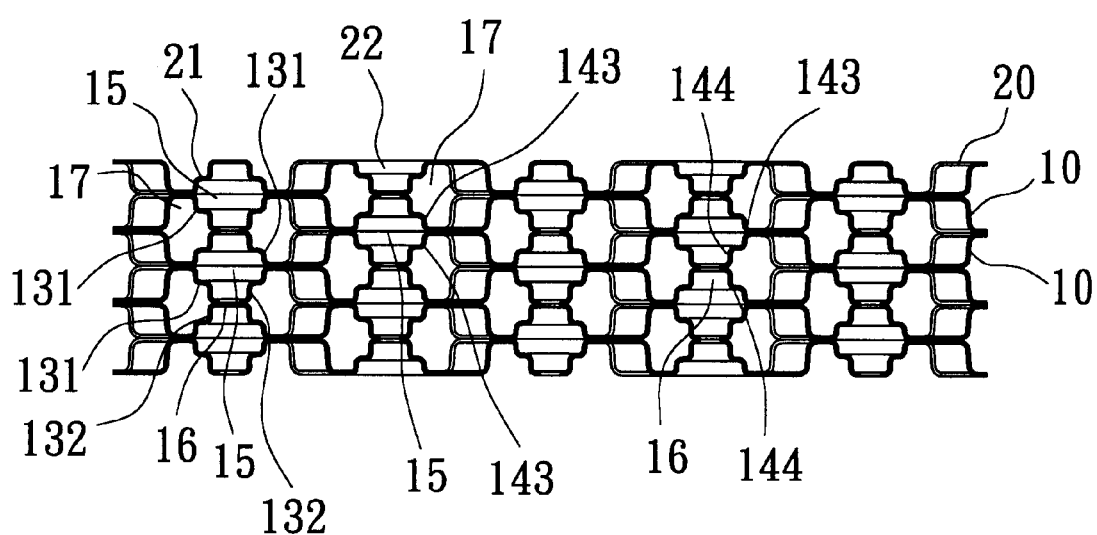
FIG. 6 is a sectional view illustrating the plates shown in FIGS. 4 and 5 after being assembled.

Referring to FIG. 6, several base plates 10 and an external plate 20 are disposed in a way of touching each other oppositely and joined together by brazing. Once the plates are fixedly attached to each other after brazing, pairs of ridges 21, 131, areas between two ridges 131 and areas between grooves 143 form horizontal tubes 15 respectively. Ridges 21, 131 and connecting tubes 132 constitute longitudinal series connection to form vertical tubes 16. Similarly, grooves 143 and connecting tubes 144 also constitute longitudinal series connection to form vertical tubes 16. Air holes 17 are disposed between adjacent horizontal tubes 15. It can be seen in FIG. 4 that the air holes 17 are formed at respective clearance between each projection and each ridge 131 and respective clearance between each depression and each groove 143. Due to design of the projecting sections 111, 121, 141, 142, turbulent effect can be enhanced while air passes through the air tubes 17 and a greater area of the base plates 10 can be contacted by air so that efficiency of heat exchange is promoted.

Figure 7:
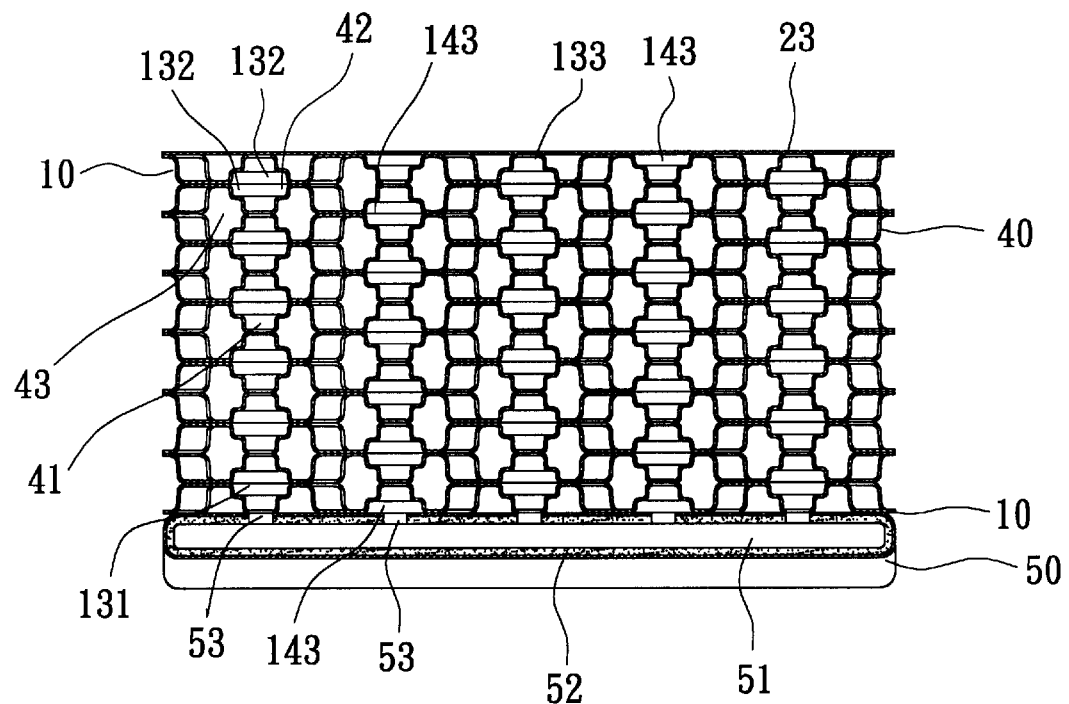
FIG. 7 is a sectional view illustrating the base plate shown in FIG. 4 and a flat plate being in a state of being assembled.

Referring to FIG. 7, alternatively a flat plate 23 replaces the external plate 20 shown in FIG. 6 to close the through holes 133 and the depressions 143 so that the same heat exchange effect as the plate assembly shown in FIG. 6 is attained.

Referring to FIG. 7 in company with FIG. 3, the vapor chamber 50 has a hollow space 51 attached with a wick layer 52 and an upper end thereof provides holes 53 corresponding to the through holes in the connecting tubes of the ridges 131 on the lowermost base plate 10 and corresponding to the grooves 143 so that the hollow space 51 is able to communicate with vertical tubes 41 of the heat exchange unit 40. The vapor chamber 50 is filled with easily evaporated liquid and the liquid flows along the wick layer 52. The hollow space 51 further houses a liquid tank 54 and a primary evaporation space 55. The liquid tank 54 stores and preheats the liquid and the liquid tank 54 and the evaporation space 55 at upper side thereof are connected to the vertical tubes 41 of the heat exchange unit 40 respectively so that a circuit is formed.

Once the present invention is in use, the metal vapor chamber 50 is placed on a heat source such as a CPU and heat dissipation paste is coated on the contact surface of the vapor chamber 50 and the CPU such that the primary evaporation space 55 can be adhered to the CPU. After the liquid in the hollow space 51 having been heated, the liquid is vaporized and rises to pass through the most of the holes 53 and enter the heat exchange unit 40. Further, the vapor rises in the vertical tubes 41 thereof and moves along the horizontal tubes 42 from the right to the left. During the vapor flowing in the tubes, the vapor contacts the lower temperature tube wall and condenses as liquid. The vapor further flows toward the right side of the figure along the horizontal tubes 42 and falls down along the vertical tubes 41 to the liquid tank 54 of the vapor chamber 50 via the holes 53. Then, the liquid passes through the wick layer 52 and arrives the evaporation space 55 to be heated and vaporized again such that heat exchange cycle can be repeated over and over. The cold air 60 or other fluid utilized in the present invention is blown to the right toward the heat exchange unit 40 from the left as shown in FIG. 3. Further, the cold air 60 enters the heat exchange unit 40 via air holes at both lateral sides of the horizontal tubes 42 to perform heat exchange. Since flow direction of the cold air is reversed to that of the liquid in the horizontal tubes 42, a counter flow arrangement is formed so that a best efficiency of heat exchange can be obtained. The liquid tank 54 and the primary evaporation space 55 at the bottom thereof can be paved with a wick layer 52. Also, the hollow chamber 51 at the lateral side and the upper side thereof can be optionally paved with another wick layer 52.

The present invention combines a conventional attach block and heat guide pipes as a single base and the heat guide pipes and tubes in the heat exchange unit can be designed as a single circuit. In this way, not only thermal resistance resulting from a conventional attach block is eliminated but also thermal resistance resulting from the attach block, the heat guide pipes and the heat exchange unit being insufficiently tight fit is eliminated. Further, pressure losses resulting from flow of the vapor being reversed to the liquid in heat guide pipes can be eliminated and the efficiency of heat exchange can be promoted greatly. Furthermore, the modular design of the present invention is advantageous for the automatic assembly and manufacture so that it is capable of saving the manufacturing cost greatly.

Figure 8:
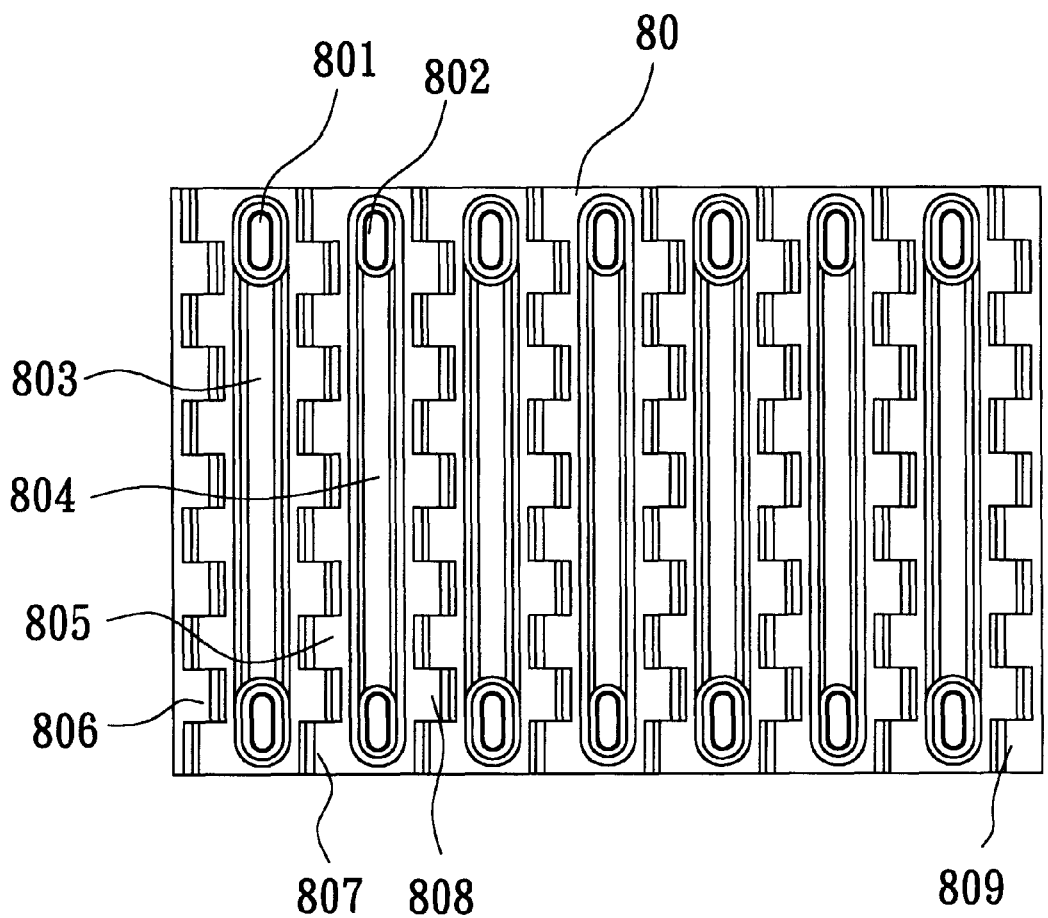
FIG. 8 is a top view of a base plate of the present invention in the second embodiment thereof.

Referring to FIG. 8 in company with FIG. 4, a second embodiment of the present invention provides a further base plate 80 in which oval-shaped connecting tubes 801, 802, has replaced the circular connecting tubes 132, 144 shown in the first embodiment. Because the oval shaped cross section has a larger area than the circular cross section, the connecting tubes on two adjacent levers can be joined more easily and firmly.

Figure 9:
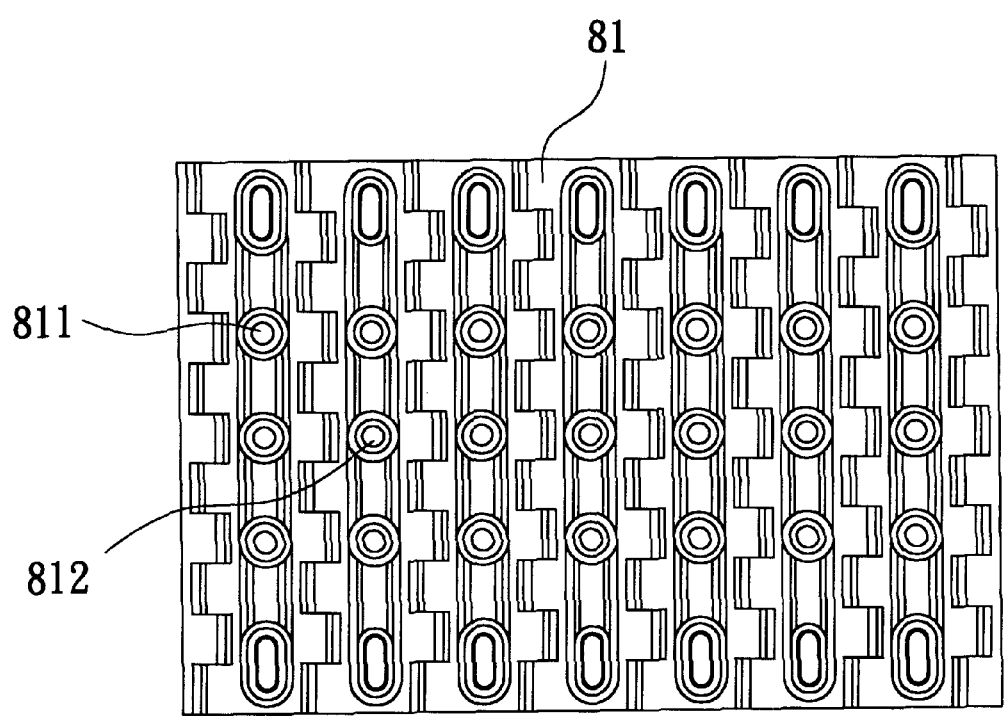
FIG. 9 is a top view of a base plate of the present invention in the third embodiment thereof.

Referring to FIG. 9 in company with FIG. 8, a third embodiment of the present invention has base plates 81. Each of the base plates 81 provides with additional circular connecting tubes 811 with or without through holes on each ridge thereof instead of the ridge 803 on the base plates 80 shown in FIG. 8. Furthermore, each groove on the base plate 81 has additional circular connecting tubes 812 with or without through holes instead of the groove 804 shown in FIG. 6. Thus, the connecting tubes 811, 812 make two adjacent base plates 81 be assembled more easily and firmly.

Figure 10:
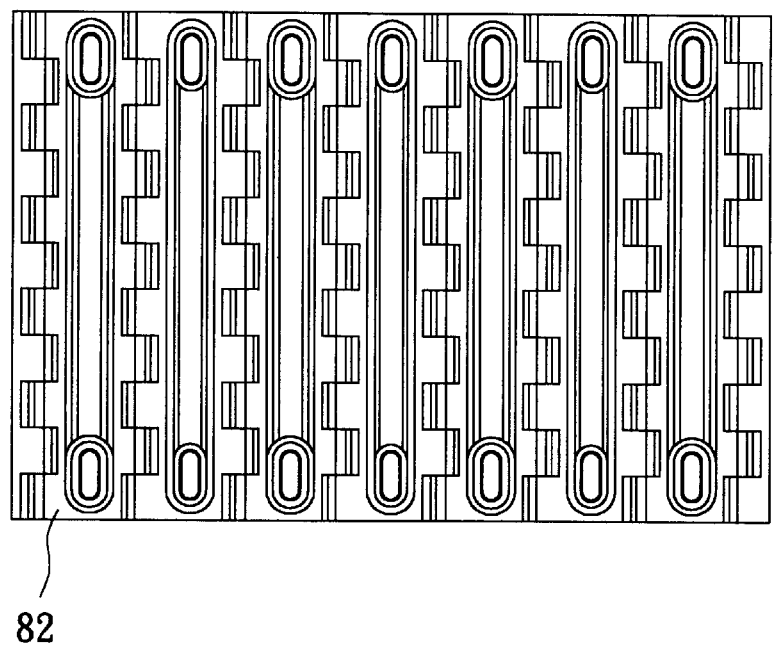
FIG. 10 is a top view of a base plate of the present invention in the fourth embodiment thereof.
Figure 11:
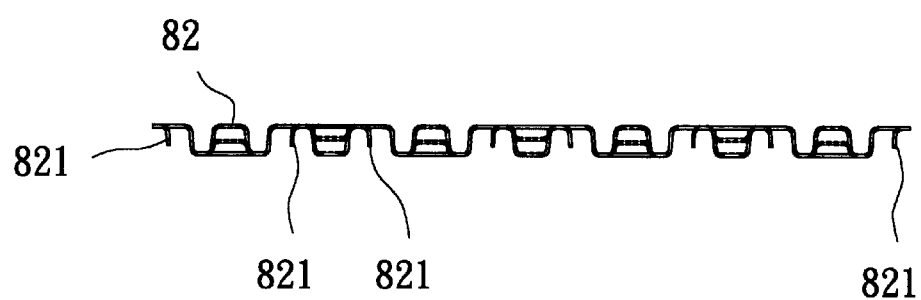
FIG. 11 is a side view of the base plate shown in FIG. 10.

As shown in FIGS. 10 and 11 in company with FIG. 8, a fourth embodiment of the present invention has base plates 82 and each of the base plates 82 is provided with reinforcing ribs 821 under each of the projecting sections.

Figure 12:
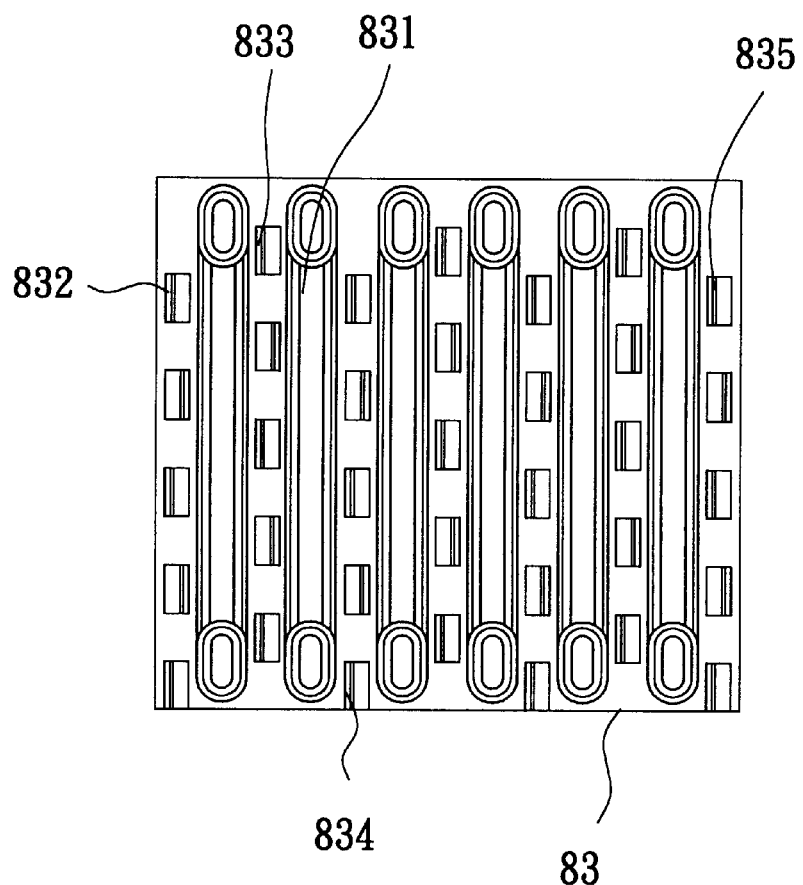
FIG. 12 is a top view of the base plates of the present invention in the fifth embodiment.
Figure 13:
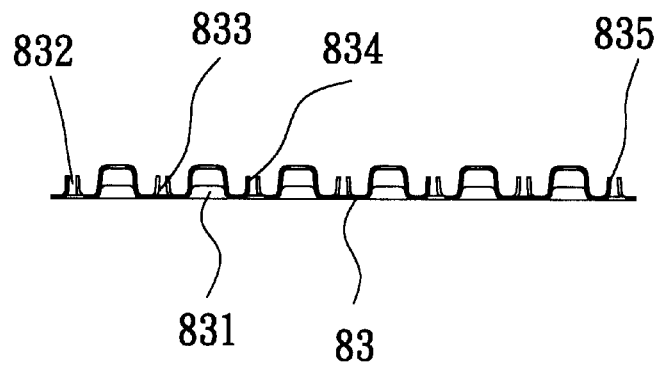
FIG. 13 is a sectional view of the base plate shown in FIG. 12.

As shown in FIGS. 12 and 13 in company with FIG. 8, a fifth embodiment of the present invention provides a further base plate 83 in which ridges 831 are arranged to replace the grooves 804 and projection sections 805 shown in FIG. 8 and projecting sections 806, 807, 808, 809 shown in FIG. 8 are replaced with reinforcing ribs 832, 833, 834, 835, respectively.

Figure 14:
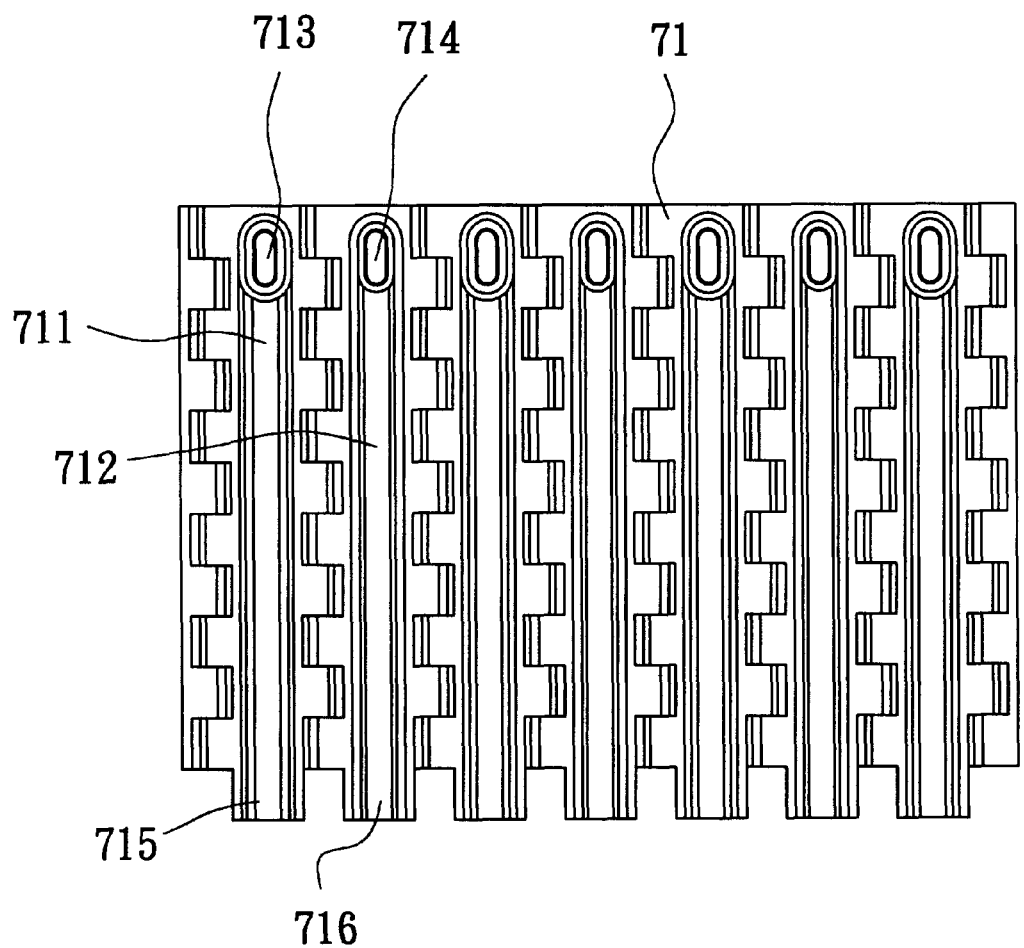
FIG. 14 is a top view of the base plate of the present invention in the sixth embodiment thereof.

As shown in FIG. 14 in company with FIG. 8, a sixth embodiment of the present invention provides a further base plate 71 which is similar to the base plate 80 shown in FIG. 8 except connecting tubes 713, 714 being placed at one ends of each ridge 711 and each groove 712 respectively and projecting sections 715, 716 being placed at the other ends of each ridge 711 and each groove 712 respectively.

Figure 15:
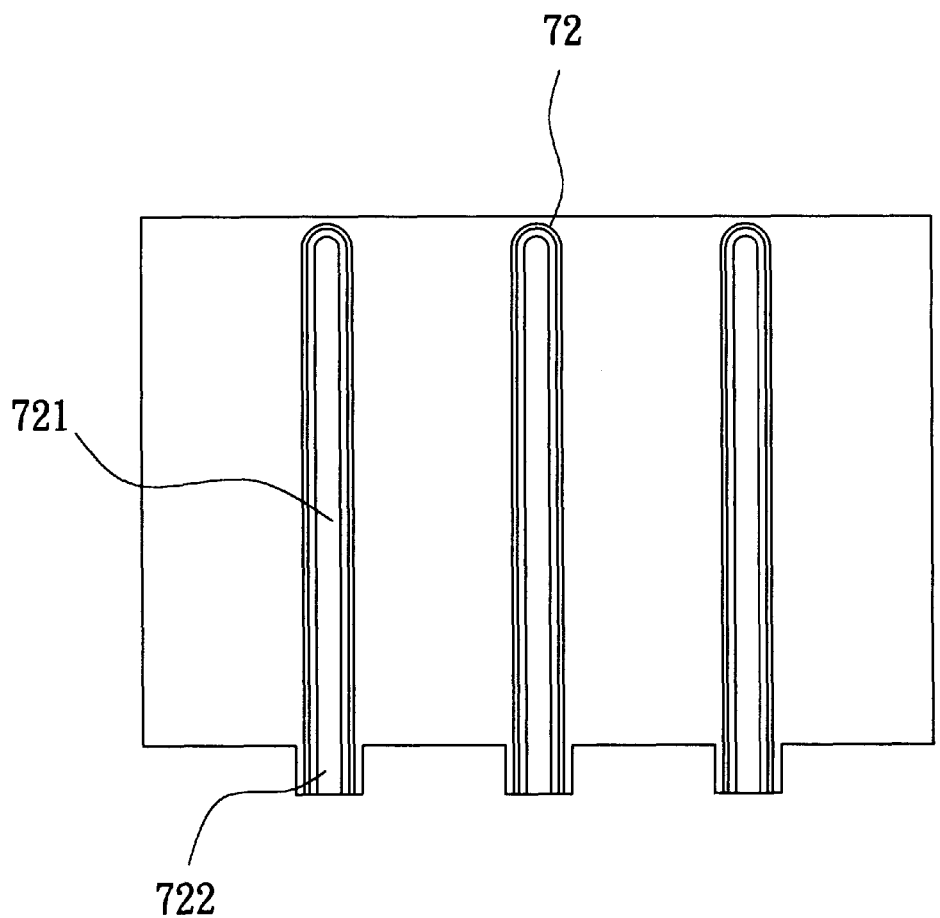
FIG. 15 is a top view of the external plate of the present invention in the sixth embodiment.
Figure 16:
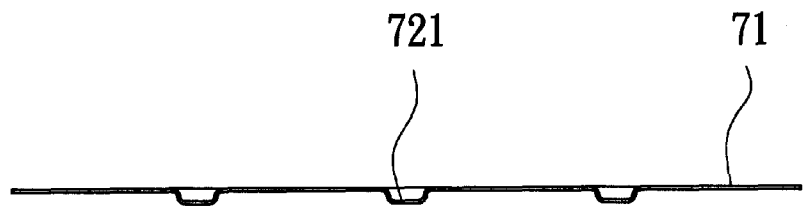
FIG. 16 is a sectional view of an external plate shown in FIG. 15.

Referring to FIGS. 15 and 16 in company with FIG. 14, a seventh embodiment of the present invention provides a further external plate 72 which is a flat plate with grooves 721 and projecting sections 722 corresponding to the grooves 712 and the projecting sections 716 of the base plates 71. The external plate 72 can be joined to a side of the base plate 71 in a way of the grooves 721 in the external plate 72 closing the grooves 712 in the base plate 71. Alternatively, the external plate 72 is a flat plate without grooves 721 to cover the grooves 712 in the base plate 71 only.

Figure 17:
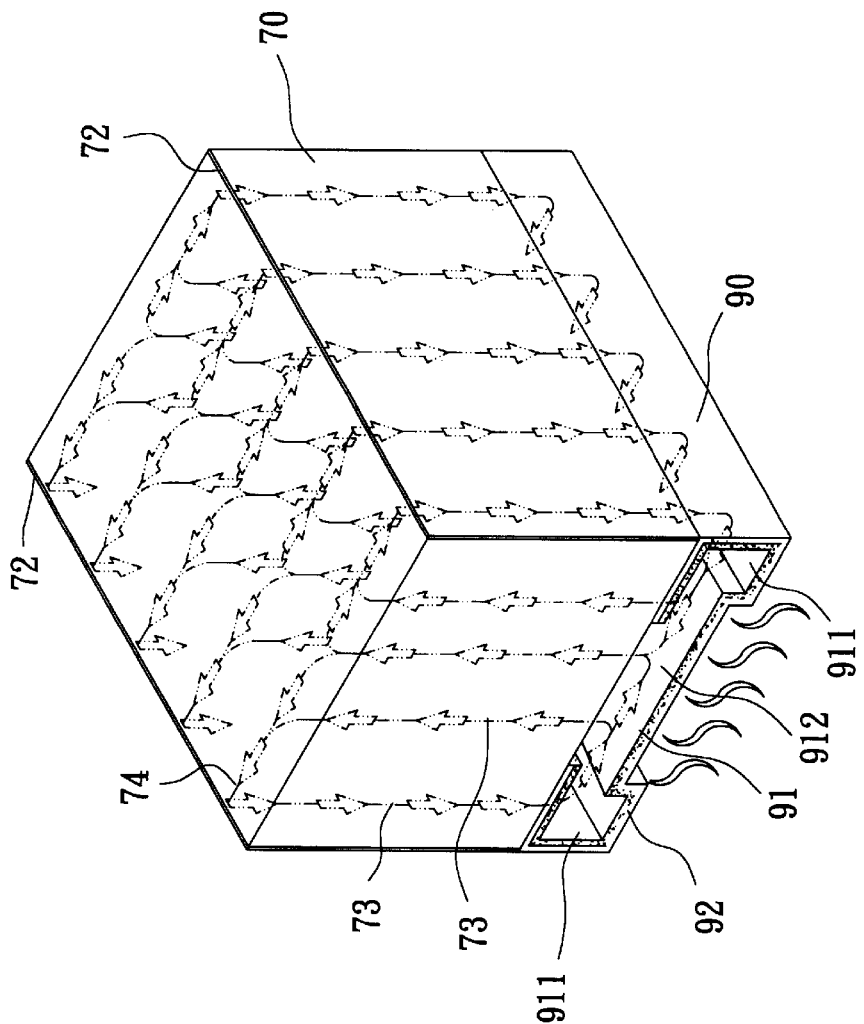
FIG. 17 is a perspective view illustrating a heat exchanger of the present invention in the sixth embodiment during use.

Referring to FIG. 17 in company with FIGS. 14 and 15, an eighth embodiment of the present invention provides another heat exchange unit 70, which is composed of multiple base plates 71 being disposed to oppositely overlap each other. Two opposite sides of the base plates 71 are connected to an external plate 72 respectively. The base plates 71 and the external plates 72 at the joining sections 715, 716, 722 thereof are disposed over and connected to a vapor chamber 90. Ridges 711 and grooves 712 of the base plate 71 are formed as vertical tubes 73 and the connecting tubes 713 and the ridges 711 as well as connecting tubes 714 and the grooves 712 are form horizontal tubes 74 respectively. The vapor chamber 90 has a hollow space 91 with two lateral sides thereof having a liquid tank 911 and a primary evaporation space 912. Liquid in the hollow space 91 is heated up and forms vapor to rise along the vertical tubes 73 via the primary evaporation 912. Further, the vapor flows along the horizontal tubes 74 toward two lateral sides thereof and moves downward along vertical tubes 73 at the lateral sides. The condensed liquid flows back to the wick layer 92 in the vapor chamber 90 for being heated up and vaporized again. In this way, the heat exchange cycle can be repeated over and over.

While the invention has been described with reference to preferred embodiments thereof, it is to be understood that modifications or variations may be easily made without departing from the spirit of this invention which is defined by the appended claims.

What is claimed is:

1. A heat exchanger, comprising:
    a) a vapor chamber, having a hollow space with a layer of wick; and
    b) a heat exchange unit having: i) a lower side which is set on said vapor chamber; ii) at least one fluid path, with air holes running next to said fluid path; iii) a metal external plate; and iv) at least one metal base plate, said at least one metal base plate and said external plate being piled up, having at least one elongated ridge with two ends, and a projecting connecting tube being located at said two ends respectively with an upper end thereof having through holes;
    wherein said hollow space in the vapor chamber and said fluid path in said heat exchange unit communicate with each other as a circuit and
    wherein every two neighboring base plates are disposed to be reversed to each other, with said ridges thereof forming horizontal tubes and said connecting tubes and said grooves thereof connecting with each other in series to form vertical tubes, and said external plate is placed on an upper most base plate to close said through holes.

2. A heat exchanger according to claim 1, wherein said hollow space has a liquid tank and a primary evaporation space; and said primary evaporation space is connected to said fluid path in said heat exchange unit and to said liquid tank respectively to form a circuit.

3. A heat exchanger according to claim 1, wherein said hollow space of said vapor chamber at two lateral sides thereof has a liquid tank respectively and a primary evaporation space is disposed at a middle part of the hollow space.

4. A heat exchanger according to claim 1, wherein each of the said base plates has at least one depression with a bottom surface and at least one projection with a top surface, said ridge being placed in said depression and said connecting tubes at said ends of said ridge and said top surface of said projection having equal heights, and said projection has a groove with two ends and a connecting tube with a through hole located at said two ends respectively in a way of said connecting tubes of said groove and said bottom surface of said depression having equal heights.

5. A heat exchanger according to claim 1, wherein each of said connecting tubes has an oval shaped cross sections.

6. A heat exchanger according to claim 1, wherein said external plate has a shape equal to that of said base plate with each of said connecting tubes thereof without a through hole.

7. A heat exchanger according to claim 1, wherein said external plate is a flat plate.

8. A heat exchanger according to claim 1, wherein said hollow space has a liquid tank and a primary evaporation space; and said primary evaporation space is connected to said fluid path in said heat exchange unit and to said liquid tank respectively to form a circuit.

9. A heat exchanger according to claim 1, wherein said hollow space of said vapor chamber at two lateral sides thereof has a liquid tank respectively and a primary evaporation space is disposed at a middle part of the hollow space.

10. A heat exchanger according to claim 1, wherein each of said ridges at two opposite sides thereof has a plurality of reinforcing ribs being disposed spacing apart from each other.

11. A heat exchanger according to claim 3, wherein said heat exchanger unit further comprises:
    a plurality of metal base plates, being joined to each other in a way of being disposed to be reversed to each other; and
    a metal external plate, being fixedly attached to two sides of said plurality of metal base plates;
    wherein, each of said plurality of metal base plates has at least one depression with a bottom surface and at least one projection with a top surface, said ridge is disposed in said depression with an end of the ridge having a connecting tube with an upper through hole and the connecting tube and said projecting are equal in heights thereof; said projection has an elongated groove with an end thereof having a connecting tube with a through hole and said connecting tube and said bottom surface of said depression are equal in heights thereof; said ridge and said groove at another ends thereof has a projection section; and said external plate provides a projection section corresponding to said projection section of the base plate to close the groove of said base plate.

12. A heat exchanger according to claim 4, wherein each of said projections at two opposite sides thereof has projecting sections spacing apart from each other; and each of said base plates at two ends thereof has a first projection and a second projection, respectively.

13. A heat exchanger according to claim 4, wherein said projecting sections have downward extending reinforcing ribs.

14. A heat exchanger according to claim 5, wherein at least one connecting tube is place between said connecting tubes at both ends of each of the ridges; and at least one connecting tube is place between said connecting tubes at both ends of each of said grooves.

15. A heat exchanger according to claim 11, wherein said external plate is a flat plate.

16. A heat exchanger according to claim 11, wherein said external plate has grooves corresponding to the grooves of said base plates.

17. A heat exchanger according to claim 11, wherein each of said projections on opposite sides thereof has projecting sections being disposed to space apart from each other.

18. A heat exchanger according to claim 12, wherein said first and second projections have a plurality of inward extending projecting sections being disposed to space apart from each other.

* * * * *